United States Patent
Kimura et al.

[11] Patent Number: 5,034,792
[45] Date of Patent: * Jul. 23, 1991

[54] FIELD-EFFECT TRANSISTOR

[75] Inventors: Takashi Kimura; Takao Kato; Kazuo Endo, all of Yokohama, Japan

[73] Assignee: Kabushiki Kaisha Toshiba, Kawasaki, Japan

[ * ] Notice: The portion of the term of this patent subsequent to Nov. 7, 2006 has been disclaimed.

[21] Appl. No.: 426,237

[22] Filed: Oct. 25, 1989

Related U.S. Application Data

[63] Continuation of Ser. No. 65,596, Jun. 23, 1987, Pat. No. 4,879,582.

[30] Foreign Application Priority Data

Jun. 25, 1986 [JP] Japan ................................ 61-148604

[51] Int. Cl.$^5$ ...................... H01L 29/78; H01L 29/34; H01L 23/48

[52] U.S. Cl. ................ 357/23.14; 357/23.1; 357/54; 357/65; 357/67; 357/71

[58] Field of Search ................ 357/42, 23.1, 23.14, 357/54, 65, 67, 71

[56] References Cited

U.S. PATENT DOCUMENTS

| | | | |
|---|---|---|---|
| 4,546,535 | 10/1985 | Shepard | 357/41 |
| 4,660,067 | 4/1987 | Ebina | 357/41 |
| 4,753,709 | 12/1988 | Welch et al. | 357/59 |

Primary Examiner—J. Carroll
Attorney, Agent, or Firm—Finnegan, Henderson, Farabow, Garrett, and Dunner

[57] ABSTRACT

A field-effect transistor wherein a gate electrode conductive layer is connected in parallel to a plurality of conductive layers having a lower resistivity than the gate electrode conductive layer, so that the gate resistance is reduced to provide a high power output and a noise reduction.

14 Claims, 7 Drawing Sheets

FIELD-EFFECT TRANSISTOR

This is a continuation of application Ser. No. 065,596, filed June 23, 1987, now U.S. Pat. No. 4,879,582.

BACKGROUND OF THE INVENTION

This invention relates to a field-effect transistor and, more particularly, to a field-effect transistor for high frequency application and power amplification.

In order to improve the high-frequency properties of a field-effect transistor, for example, a metal oxide semiconductor field-effect transistor (hereinafter referred to as "MOS FET"), it is necessary to reduce gate resistance Rg, source resistance Rs, and gate input capacity Ciss, and to increase mutual conductance gm. To this end, it is the common practice in the manufacture of high-frequency MOS FETs to form the source and drain regions in self-alignment with the gate electrode. In order to form the source and drain regions in self-alignment with the gate electrode, the gate electrode must be made of a compound of silicon with a refractory metal such as molybdenum (Mo), tungsten (W), tantalum (Ta), titanium (Ti), etc. The self-aligning fabrication of the source and drain regions is carried out by implanting an impurity ion in the substrate, with the gate electrode used as a mask, and by annealing at a temperature around 1000° C. in order to activate the implanted ions.

However, where the gate electrode is made of a low-melting point metal such as aluminium, which is widely used as an electrode material, the gate electrode undesirably tends to melt during the heating process. Therefore, in order to form the source and drain regions in a self-aligned manner, it is necessary to fabricate the gate electrode from a pefractory metal.

Also, for the manufacture of a power-amplifying MOS FET device for high power applications, it is common practice to connect a plurality of small-scale FET cells in parallel, so as to elevate the mutual conductance gm and to minimize heat resistance.

FIGS. 1 and 2 illustrate the arrangement of a conventional MOS FET for high frequency and power amplification, wherein the gate-electrode is fabricated from a refractory metal.

FIG. 1 is a plan view of the pattern of the prior art MOS FET. FIG. 2 is a sectional view along line A—A' of FIG. 1.

Referring to FIGS. 1 and 2, reference numeral 40 represents a P+-conductivity type silicon substrate; reference numeral 41 denotes a P-conductivity type epitaxial silicon layer; reference numeral 42 shows a silicon oxide layer acting as a gate insulating layer; reference numeral 43 denotes a gate electrode made of a compound of refractory metals-for example, molybdenum and silicon; reference numeral 44 shows an interlaid insulation film; reference numeral 45 indicates a source electrode made of a metal such as aluminium; reference numeral 46 represents a drain electrode made of the same metal as source electrode 45; reference numeral 47 denotes a contact hole through which a drain layer (not shown) is connected to drain electrode 46; reference numeral 48 shows a contact hole through which a source layer (not shown) is connected to source electrode 45; reference numeral 49 indicates a bonding electrode for leading out the gate electrode; reference numeral 50 denotes a contact hole through which gate electrode 43 is connected to bonding electrode 49 for leading out the gate electrode; reference numeral 51 shows a bonding electrode for leading out a drain electrode; and reference numeral 52 represents a bonding electrode for leading out a source electrode.

An MOS FET whose gate electrode is made of a compound of a refractory metal and silicon has the drawback in that the specific resistivity of the gate electrode is about 2 to several hundreds of times higher than that of the gate electrode made of aluminium. An electrode made of only molybdenum or tungsten, both having a relatively low resistivity, tends to react vigorously with water, thus eventually leading to the unreliability of the resultant MOS FET. With the prior art field-effect transistor, therefore, the gate resistance Rg could not be sufficiently reduced, thus imposing limitations on the high-frequency property of the MOS FET.

In a high-power apparatus comprising a plurality of cells of MOS FETs, those cells apart from the bonding electrode for leading out the gate electrode have greater resistance because the gate electrodes of the cells are connected together via a common gate electrode layer. Therefore, the high-frequency properties of the transistor are unsatisfactory.

Further, the manufacture of a low-noise high-frequency field-effect transistor presents difficulties because the gate resistance can not be reduced, and thus, high power output and noise reduction cannot be attained.

As described above, in the prior art field-effect transistor, the gate resistance cannot be reduced, and therefore, a high power output and noise reduction cannot be attained.

SUMMARY OF THE INVENTION

This invention has been developed in view of the above-mentioned circumstances and is intended to provide a field-effect transistor wherein the gate resistance can be sufficiently lowered, thereby enabling a high power output and noise reduction to be easily attained.

To this end, the present invention provides a semiconductor substrate of a first conductivity type, comprising drain and source layers both of a second conductivity type which are formed on the semiconconductor substrate; a channel region, also of first conductivity type, which is defined between drain and source regions; an insulation layer including a gate insulation layer which is formed on the semiconductor substrate; a first conductive layer for a gate electrode which is formed on said gate insulation layer and is provided with an extension protruding beyond the channel region defined between the drain and source regions; an interlaid insulation layer which is formed on the first conductive layer; a second conductive layer for leading out the gate electrode, and which is connected to the first conductive layer via a first contact hole formed in the interlaid insulation layer; and a third conductive layer which is connected to the first conductive layer via a second contact hole formed in the interlaid insulation layer.

DESCRIPTION OF THE PREFERRED EMBODIMENTS

Figure 1:
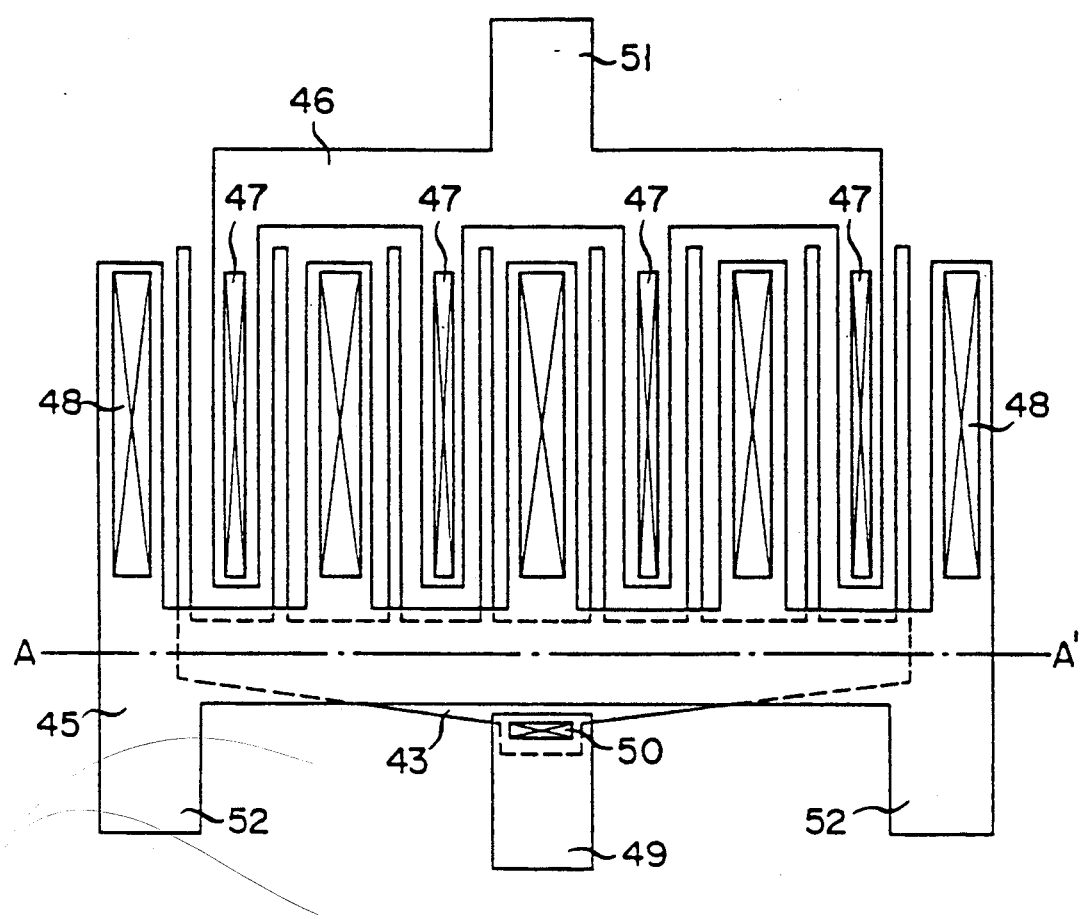
FIG. 1 shows the pattern of a conventional MOS transistor.
Figure 2:
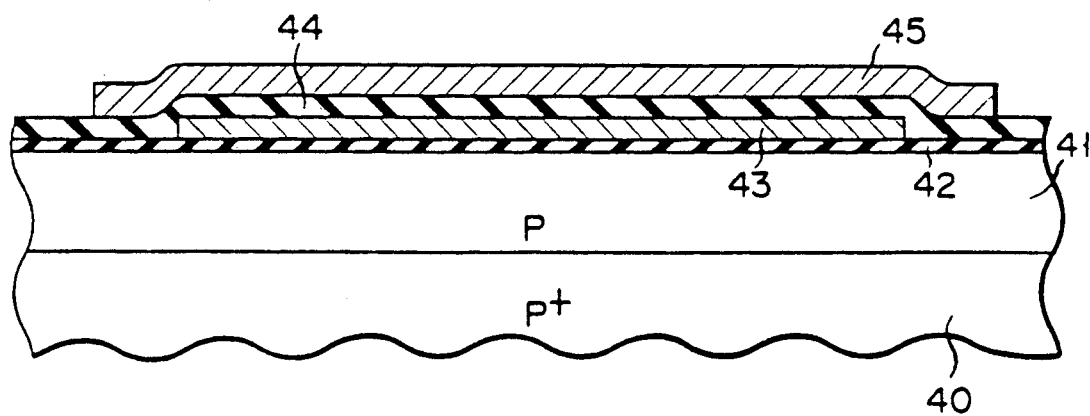
FIG. 2 is a sectional view along line A—A' of the MOS transistor of FIG. 1.

A description of the presently preferred embodiments will now be provided with reference to the appended drawings wherein like reference characters refer to like or corresponding parts throughout.

Figure 3:
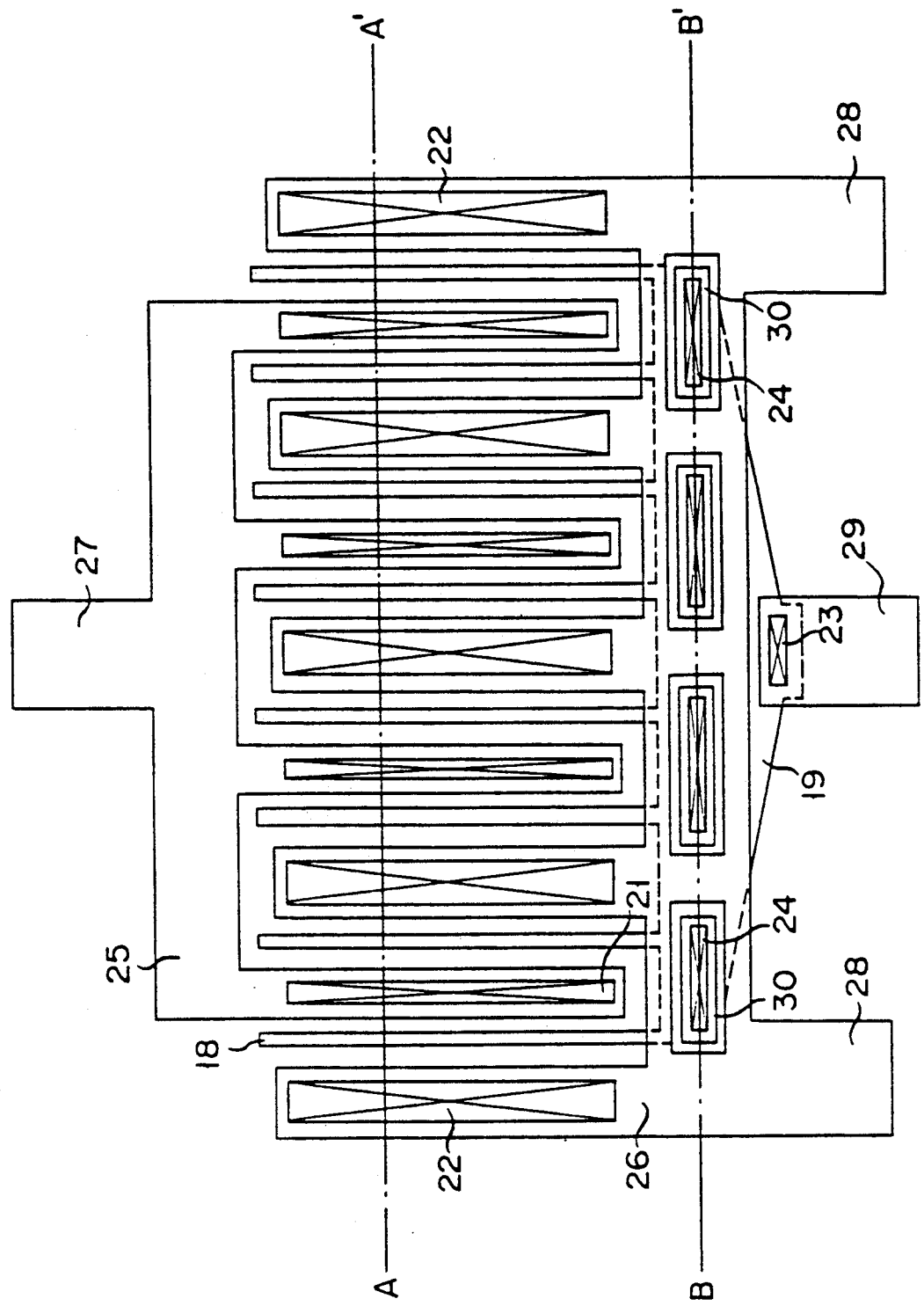
FIG. 3 illustrates the pattern of an MOS transistor according to a first preferred embodiment of the present invention.
Figure 4:
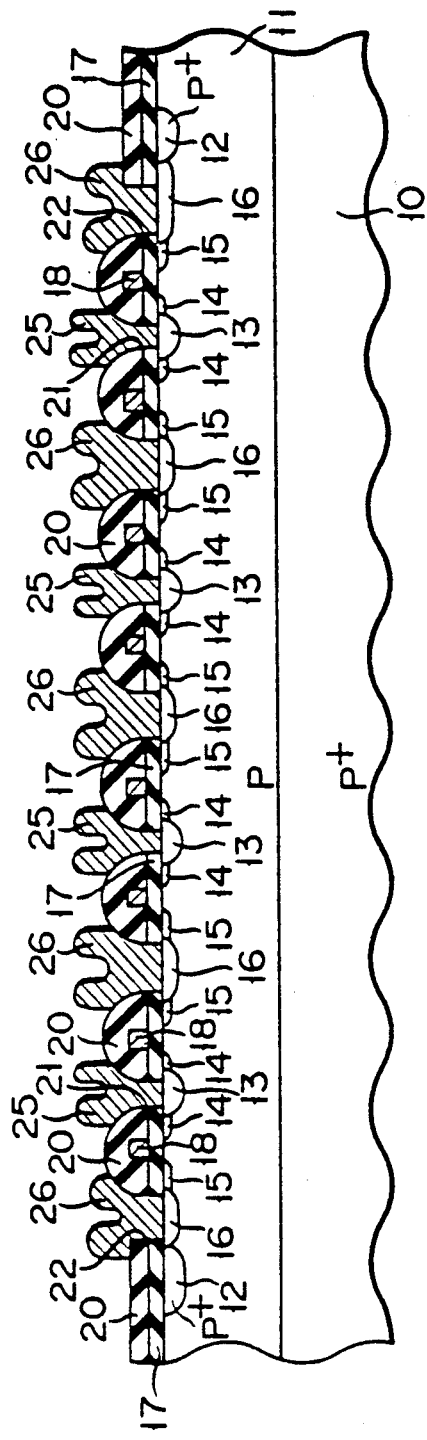
FIG. 4 is a sectional view along line A—A' of the MOS transistor of FIG. 3.
Figure 5:
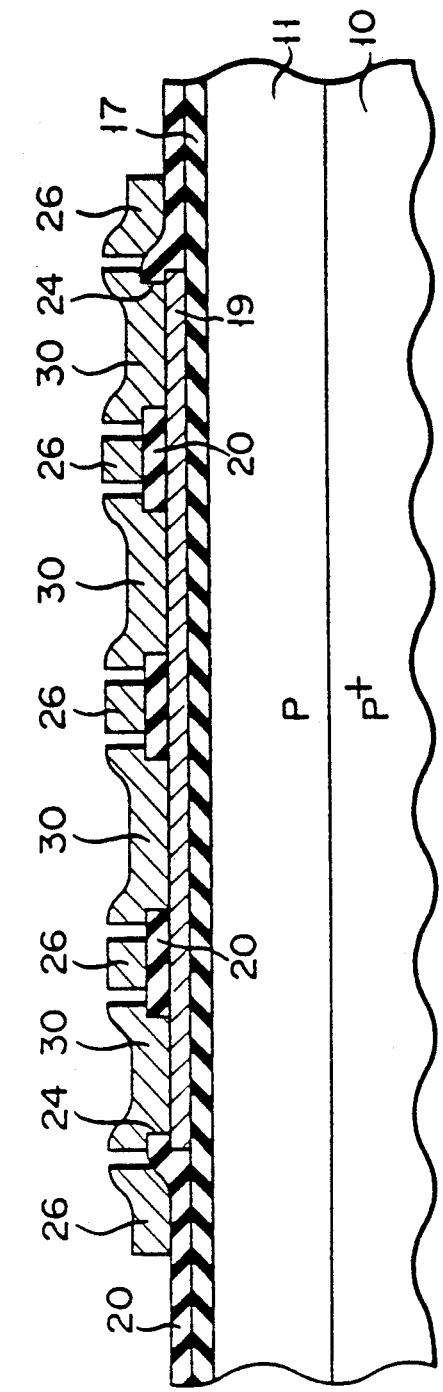
FIG. 5 is a sectional view along line B—B' of the MOS transistor of FIG. 3.

FIGS. 3 to 5 illustrate a MOS field-effect transistor according to a first preferred embodiment of the present invention. FIG. 3 is a plan view of the pattern of the MOS field-effect transistor. FIG. 4 is a sectional view along line A—A' of the transistor of FIG. 3, and FIG. 5 is a sectional view along line B—B' of the transistor of FIG. 3.

In FIGS. 4 and 5, reference numeral 10 denotes a P+ conductivity type silicon substrate having a high concentration of a P type impurity. Reference numeral 11 is a P conductivity type silicon epitaxial layer formed on substrate 10 by an epitaxial growth process. Reference numeral 12 denotes a P+ conductivity type channel stopper formed by implanting boron (B) into epitaxially grown silicon layer 11. In FIG. 4, channel stopper 12 is represented by two parts separated on the right and left sides. In fact, however, channel stopper 12 has such a ring-shape as surrounds the channel region.

As seen from FIG. 4, epitaxially grown silicon layer 11 includes an N conductivity type well layer 13 formed by the ion implantation of phosphorus (P); an N− conductivity type drain layer 14; an N+ conductivity type source layer 15 formed by the ion implantation of arsenic (As); and an N+ conductivity type source contact layer 16 formed by the ion implantation of arsenic (As).

As shown in FIGS. 4 and 5, silicon oxide layer 17 for a gate insulation layer is formed, for example, by thermal oxidation with a thickness of about 1000 Å on epitaxially grown silicon layer 11. Gate electrode layer 18, made of a compound of a refractory metal, for example, molybdenum, and silicon, is formed on silicon oxide layer 17. Gate electrode layer 18 is positioned above a channel region lying between drain layer 14 and source layer 15 and further comprises portion 19 extending beyond the channel region. N− type drain layer 14 and N+ type source layer 15 are formed by implanting an ion of a predetermined impurity into epitaxial silicon layer 11 with gate electrode layer 18 used as a mask, and by annealing the structure for activation of the implanted ion at a temperature of about 1000° C. for about 30 minutes.

Reference numeral 20 represents a silicon oxide layer used as an interlaid insulation layer which is formed by the CVD process (chemical vapor deposition process) on gate electrode layer 18 including extention 19. As shown in FIG. 4, contact holes 21, 22 for N wells 13 and source contact layers 16, respectively, are formed in the laminated structure composed of silicon oxide layer 20 and underlying silicon oxide layer 17 by well-known photolithography and etching processes. As indicated in FIG. 3, contact hole 23 is formed at the end of the extension of gate electrode 18. As illustrated in FIGS. 3 and 5, a plurality (four in this embodiment) of holes 24 are formed at the extension of gate electrode layer 18.

Reference numeral 25 represents a drain electrode. Drain electrode 25 is made of a metal, for example, aluminium, having a lower resistance and lower melting point than gate electrode layer 18 composed of a compound of molybdenum and silicon. Drain electrode 25 contacts drain N well layer 13 via contact holes 21. Reference numeral 26 denotes a source electrode which is made of aluminium and reaches source contact layer 16 via contact holes 22. A broad portion of drain electrode 25, which extends outwardly from the MOS FETs, constitutes drain electrode-lead bonding electrode 27. A wide portion of source electrode 26, which protrudes outwardly from the MOS FETs, constitutes source electrode-lead bonding electrode 28. Reference numeral 29 denotes a gate electrode-lead bonding electrode which is made of aluminium and is connected to extention 19 of gate electrode 18 via contact hole 23. Reference numeral 30 denotes island-shaped electrodes which are made of aluminium and are connected to the extension 19 of the gate electrode layer 18 via contact holes 24. Drain electrode 25, source electrode 26, drain electrode-lead bonding electrode 27, source electrode-lead bonding electrode 28, gate electrode-lead bonding electrode 29 and island-shaped electrode 30 are provided by forming an aluminium layer on the structure by chemical vapor deposition after the formation of the contact holes and by patterning the aluminium layer.

The field effect transistor shown in FIGS. 3 to 5 is characterized in that extension 19 of gate electrode 18, which protrudes beyond the channel region, contacts island-shaped electrodes 30 having a lower resistivity than gate electrode 18. This means that a resistor, i.e., island-shaped electrodes 30, having a lower resistance than gate electrode 18, are connected in parallel with extension 19. Consequently, extension 19 of gate electrode 18 substantially decreases in resistance, thereby ensuring a reduction in gate resistance Rg. To give a concrete instance, when the gate electrode layer was only composed of a compound of molybdenum and silicon as has been customarily the case, gate resistance Rg was as high as around 10$\frac{1}{4}$. In contrast, the field-effect transistor of the first preferred embodiment enables gate resistance Rg to drop to a level of about 2 $\frac{1}{4}$. Therefore, while the conventional field-effect transistor had an output efficiency of only about 30% at a frequency of 500 MHz and an output of 50 W, the present invention has the noticeable characteristics that the output efficiency is elevated to as high as about 60% at a frequency of 860 MHz and an output of 50 W. This invention offer the further advantage that, since the gate resistance can be decreased, noise can be reduced.

A MOS field-effect transistor according to a second preferred embodiment of the invention will now be described with reference to FIGS. 6 and 7.

Figure 6:
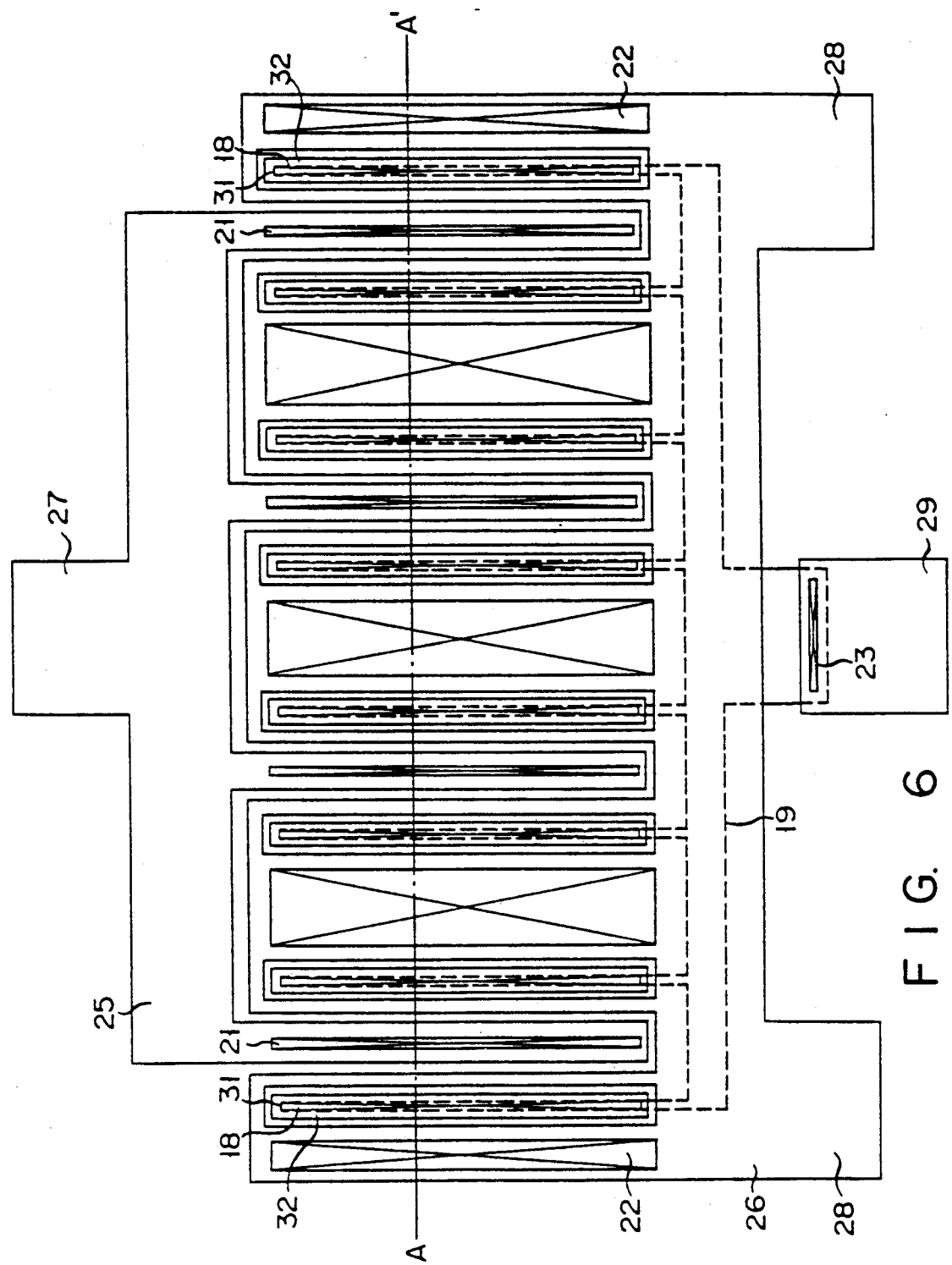
FIG. 6 illustrates the pattern of an MOS transistor according to a second preferred embodiment of the present invention.
Figure 7:
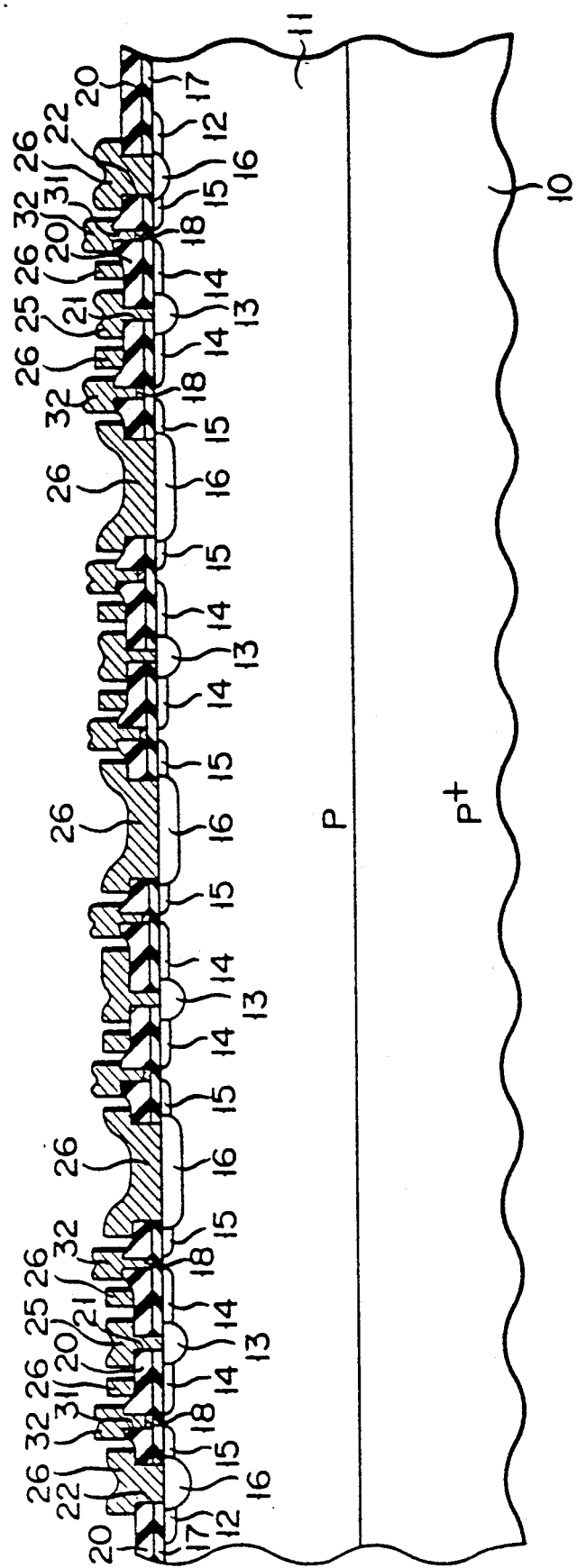
FIG. 7 is a sectional view along line A—A' of the MOS transistor of FIG. 6.

FIG. 6 is a plan view, and FIG. 7 is a sectional view along line A—A' of the transistor of FIG. 6.

Reference numeral 10 shows a P+ type silicon substrate. Reference numeral 11 represents a P type silicon epitaxial layer. Reference numeral 12 indicates a P+ type channel stopper. Reference numeral 13 indicates a drain N well layer. Reference numeral 14 denotes an N− type drain layer. Reference numeral 15 denotes an N+ source layer. Reference numeral 16 shows an N+ source contact layer. Reference numeral 17 indicates a silicon oxide layer. Reference numeral 18 denotes a gate electrode. Reference numeral 19 represents the extension of gate electrode 18. Reference numeral 20 indicates a silicon oxide layer. Reference numerals 21, 22 denote contact holes reaching drain N well layer 13 and source contact layer 16, respectively. Reference numeral 23 shows a contact hole reaching gate electrode 18 at the end of extension 19. Reference numeral 25 is a drain electrode, and reference numeral 26 is a source electrode. Reference numeral 27 indicates a bonding electrode for a drain electrode lead. Reference numeral 28 indicate a bonding electrode for source electrode lead. Reference numeral 29 shows a bonding electrode for a gate electrode lead.

The MOS FET of FIGS. 6 and 7 is different from that of FIGS. 3 to 5 in that contact holes 31 provided in silicon oxide layer 20 contact those portions of the gate electrode layer which are located on the channel regions. Gate electrode 18 contacts island-shaped electrodes 32 having a lower resistance than gate electrode 18 via contact holes 31.

The MOS FET of this embodiment is of the so-called field plate type and, thus, the strength of the field is reduced at those portions of drain layer 14 and source layer 15 which are near the channel region.

In the embodiment shown in FIG. 6 and 7, island-shaped electrodes 32 having a lower resistance than gate electrodes 18 contact those portions of gate electrodes 18 which lie above the channel region. This means that a resistor, i.e., island-shaped electrodes 32, having a lower resistance than gate electrode 18 are connected in parallel, thereby substantially decreasing the resistance of gate electrode 18, and also reducing the gate resistance Rg.

In the embodiment of FIGS. 6 and 7, island-shaped electrodes 32 are set remote from gate electrode-lead bonding electrode 29. Moreover, island-shaped electrode 32 is formed in that region where a channel should be provided. As a result, the gate resistance Rg which stood at about 10⅓ when the gate electrode was made only of a compound of molybdenum and silicon, as has been customarily the case in the past has been noticeably reduced to 1⅓ in the field-effect transistor embodying the present invention. Therefore, while the conventional field-effect transistor indicated an output efficiency of about 40% at a the frequency of 500 MHz and an output of 50 W, this embodiment of the present invention resulted in 60% output efficiency at a frequency of 860 MHz and an output of 100 W.

It will be noted that the present invention is not limited to the embodiments, but is obviously applicable in various modifications. For instance, the first embodiment of FIGS. 3-5 and the second embodiment of FIGS. 6-7, may be combined so that, as shown in FIGS. 8-10, the island-shaped electrodes may be provided to both the extension 19 of gate electrode 18 and that portion of the gate electrode 18 which is above the channel region, reducing the gate resistance more than that in FIG. 6 or FIG. 7 embodiment.

Figure 8:
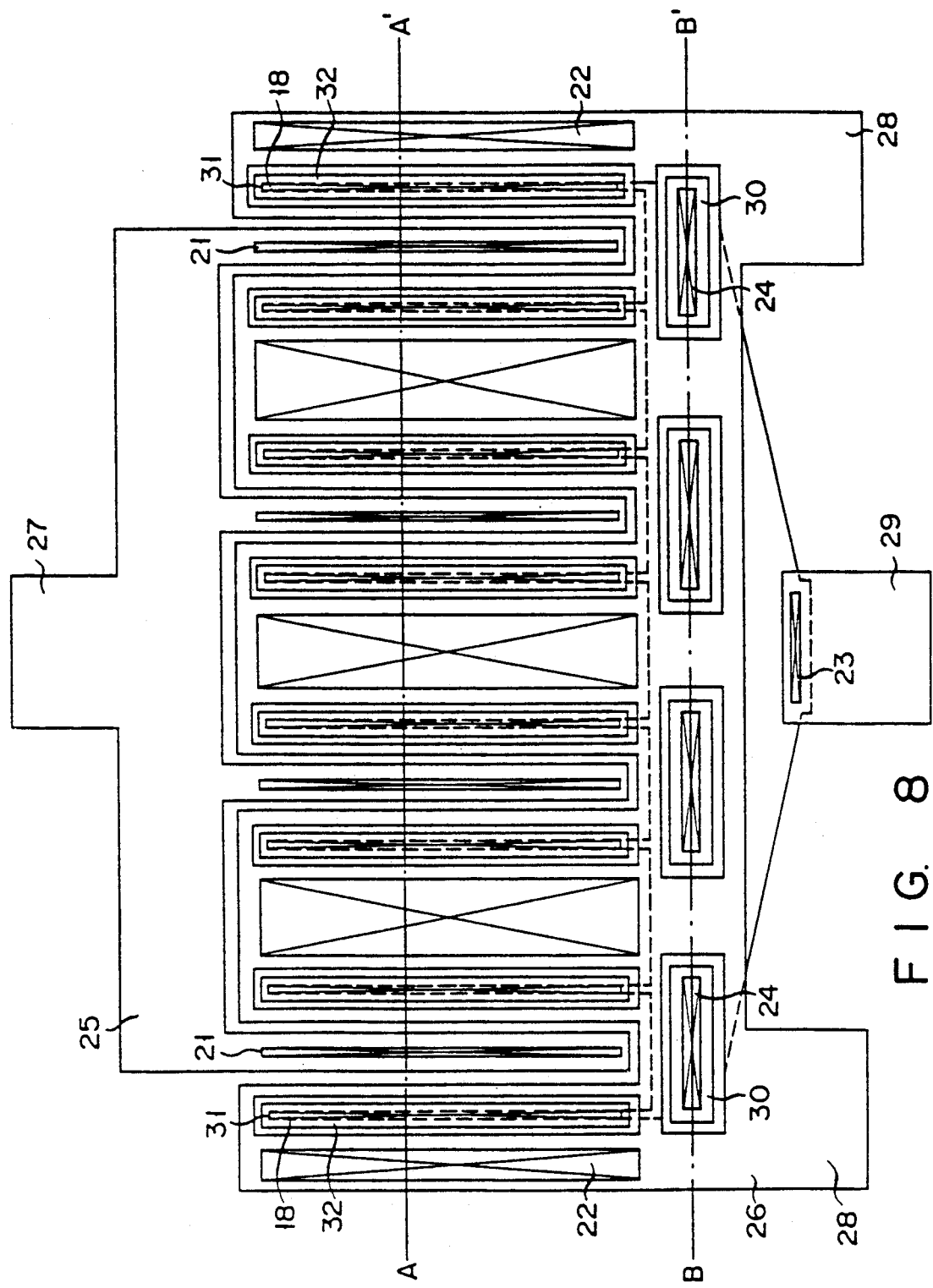
FIG. 8 shows the pattern of an MOS transistor according to a third preferred embodiment of the present invention.
Figure 9:
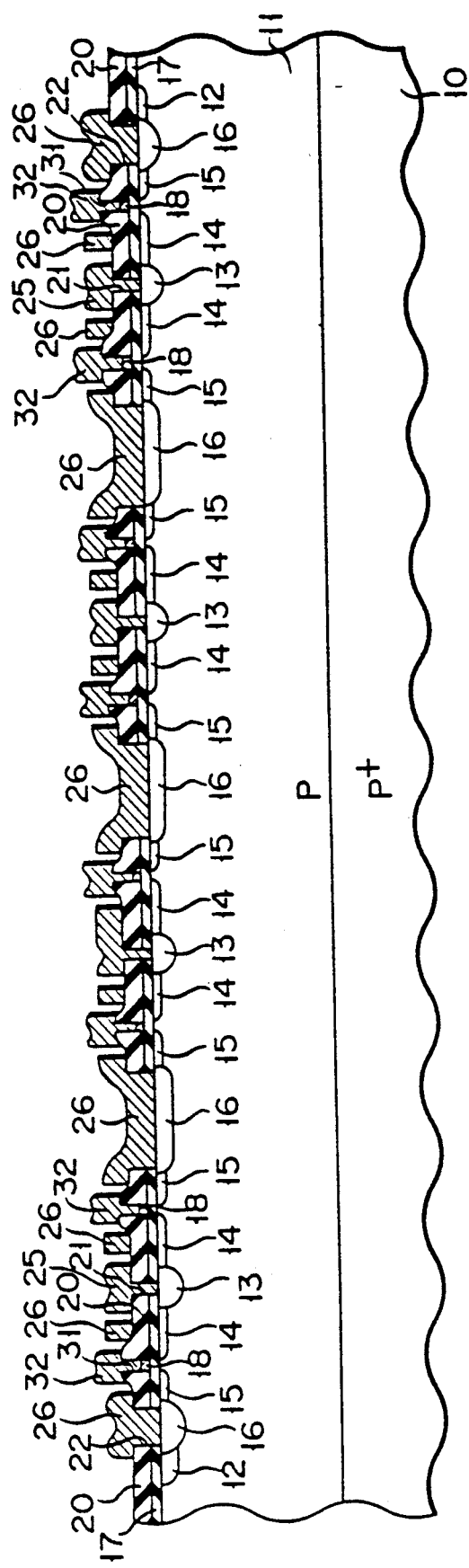
FIG. 9 is a sectional view along line A—A' of the MOS transistor of FIG. 8.
Figure 10:
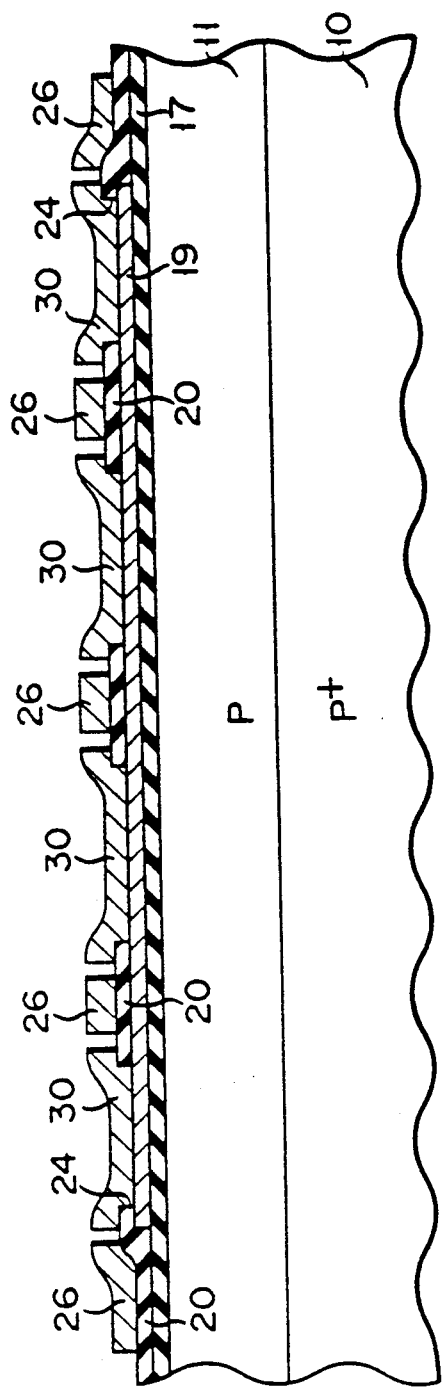
FIG. 10 is a sectional view along line B—B' of the MOS transistor of FIG. 8.

This embodiment of FIGS. 8-10 is a combination of the embodiment of FIGS. 3-5 and the embodiment of FIG. 6 and 7. Therefore, the parts of FIGS. 8-10 the same as those of FIGS. 3-7 are denoted by the same numerals and the descriptions thereof are omitted.

The foregoing embodiments relates to the case where the present invention was applied to a MOS FET. Obviously, the invention is also applicable to a multilayer type field-effect transistor where gate, source and drain electrodes are provided with an insulation layer interposed therebetween, for instance, a field-effect transistor having the Schottky structure.

As will be clearly understood from the above, according to the present invention, a field-effect transistor is provided in which gate resistance can be significantly lowered, thereby attaining a high power output and noise reduction.

What is claimed is:

1. A field effect transistor device which comprises:
   a semiconductor substrate of a first conductivity type;
   a plurality of drain and source regions of a second conductivity type formed in said semiconductor substrate;
   a plurality of channel regions of said first conductivity type positioned between respective one of said drain and source regions;
   a drain electrode layer having a plurality of finger portions extending on and connected to respective ones of said drain regions, and a base portion extending beyond said drain regions;
   a source electrode layer having a plurality of finger portions extending on and connected to respective ones of said source regions, and a base portion extending beyond said source regions;
   a first gate insulation layer formed on said semiconductor substrate;
   a gate electrode layer having a plurality of finger portions formed on a portion of said first gate insulation layer above respective ones of said channel regions and a base portion extending beyond said channel regions, said gate electrode base portion interconnecting said gate electrode finger portions;
   a second gate insulation layer formed on said gate electrode layer between said gate electrode layer base portion and said source electrode layer base portion;
   a gate bonding electrode layer connected to said gate electrode layer via a first contact hole formed in said second gate insulation layer, said gate electrode layer base portion and said source electrode layer base portion being disposed between said gate bonding electrode layer and said channel regions; and
   a conductive layer connected to and positioned above said gate electrode layer via a second contact hole formed in said second gate insulation layer, said gate electrode layer being disposed between said conductive layer and said gate bonding electrode layer.

2. The field-effect transistor device according to claim 1, wherein said conductive layer is formed above said channel region.

3. The field-effect transistor device according to claim 1, wherein said conductive layer is formed on said gate electrode layer base portion.

4. The field-effect transistor device according to claim 2, wherein said conductive layer includes a plurality of island shapes.

5. The field-effect transistor device according to claim 3, wherein said conductive layer includes a plurality of island shapes.

6. The field-effect transistor device according to claim 1, wherein said conductive layer comprises a material having a lower specific resistivity than said gate electrode layer.

7. The field-effect transistor device according to claim 1, wherein said gate electrode layer comprises a metal having a high melting point and silicon.

8. The field effect transistor device according to claim 1, wherein said gate bonding electrode layer and said conductive layer are comprised of the same material.

9. A field-effect transistor device which comprises:
a semiconductor substrate of a first conductivity type;
a plurality of transistor regions positioned adjacent to one another in the semiconductor substrate, each of the transistor regions including a drain region, a source region, and a channel region located between the drain region and the source region, the drain and source regions being of the first conductivity type and the channel regions being of a second conductivity type;
a first insulation layer formed on the semiconductor substrate;
a gate electrode layer formed on the first insulation layer and having a base portion and a plurality of finger portions connected to and extending from the gate electrode layer base portion, the gate electrode layer base portion being disposed in a base portion of the semiconductor substrate outside the transistor regions, and each of the gate electrode layer finger portions extending above and being capacitively coupled to a corresponding one of the channel regions through the first insulation layer;
a second insulation layer formed on the first insulation layer and the gate electrode layer;
a source electrode layer formed on the second insulation layer having a base portion and a plurality of finger portions connected to and extending from the source electrode layer base portion, each of the source electrode layer finger portions extending above and connected to a corresponding one of the source regions through the first and second insulation layers;
a gate bonding electrode layer connected to the gate electrode layer base portion, the base region of the semiconductor substrate being disposed between the gate bonding electrode layer and the channel regions; and
a plurality of conductive layers formed adjacent to and spaced from one another on the second insulation layer adjacent to corresponding ones of the gate electrode layer finger portions, the conductive layers being connected to and disposed above the gate electrode layer through the second insulation layer and being ohmically isolated from the source and drain electrode layers, and the gate electrode layer being disposed between the conductive layers and the gate bonding electrode layer.

10. The field-effect transistor device according to claim 9, wherein each of the conductive layers is formed above a corresponding one of the channel regions.

11. The field-effect transistor device according to claim 9, wherein at least one of the conductive layers is formed on the gate electrode layer base portion.

12. The field-effect transistor device according to claim 9, wherein the conductive layers comprise a material having a lower specific resistivity than the gate electrode layer.

13. The field-effect transistor device according to claim 9, wherein the gate electrode layer comprises a metal having a high melting point and silicon.

14. The field-effect transistor device according to claim 9, wherein the gate bonding electrode layer and the conductive layer comprise the same material.

* * * * *